(12) United States Patent
Kim

(10) Patent No.: US 9,548,300 B2
(45) Date of Patent: Jan. 17, 2017

(54) SEMICONDUCTOR DEVICE INCLUDING CAPACITOR AND METHOD FOR MANUFACTURING THE SAME

(71) Applicant: SK hynix Inc., Gyeonggi-do (KR)

(72) Inventor: Jung-Sam Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/853,766

(22) Filed: Sep. 14, 2015

(65) Prior Publication Data

US 2016/0336311 A1 Nov. 17, 2016

(30) Foreign Application Priority Data

May 11, 2015 (KR) .......................... 10-2015-0065181

(51) Int. Cl.
*H01L 27/108* (2006.01)
*H01L 29/94* (2006.01)
*H01L 27/06* (2006.01)
*H01L 49/02* (2006.01)

(52) U.S. Cl.
CPC .......... *H01L 27/0676* (2013.01); *H01L 28/60* (2013.01); *H01L 29/94* (2013.01)

(58) Field of Classification Search
CPC ....... H01L 27/0676; H01L 29/94; H01L 28/60
See application file for complete search history.

(56) References Cited

U.S. PATENT DOCUMENTS

| 5,401,680 | A | * | 3/1995 | Abt | H01L 27/11502 257/E21.009 |
| 6,159,818 | A | * | 12/2000 | Durcan | H01L 27/10817 257/E21.019 |
| 6,187,624 | B1 | * | 2/2001 | Huang | H01L 27/10852 257/E21.019 |
| 6,630,380 | B1 | * | 10/2003 | Joy | H01L 21/76895 257/E21.009 |
| 7,981,757 | B2 | * | 7/2011 | Burke | H01L 21/76801 257/528 |
| 8,470,667 | B2 | | 6/2013 | Koo | |
| 8,546,232 | B2 | | 10/2013 | Sako | |
| 8,716,775 | B2 | | 5/2014 | Kim | |
| 2005/0244988 | A1 | * | 11/2005 | Wang | H01L 27/11502 438/3 |
| 2013/0026551 | A1 | * | 1/2013 | Kim | H01L 27/0733 257/296 |

* cited by examiner

*Primary Examiner* — Victora A Mandala
(74) *Attorney, Agent, or Firm* — IP & T Group LLP

(57) ABSTRACT

A semiconductor device includes a semiconductor substrate having a first region and a second region; a first planar type capacitor including a gate electrode which is positioned in any one region of the first region and the second region; a non-planar type capacitor including a plurality of non-planar type electrodes which are positioned in the other region of the first region and the second region; a second planar type capacitor including a planar type electrode which is positioned over the first planar type capacitor to overlap with the first planar type capacitor; and a common node under the non-planar type capacitor.

8 Claims, 13 Drawing Sheets

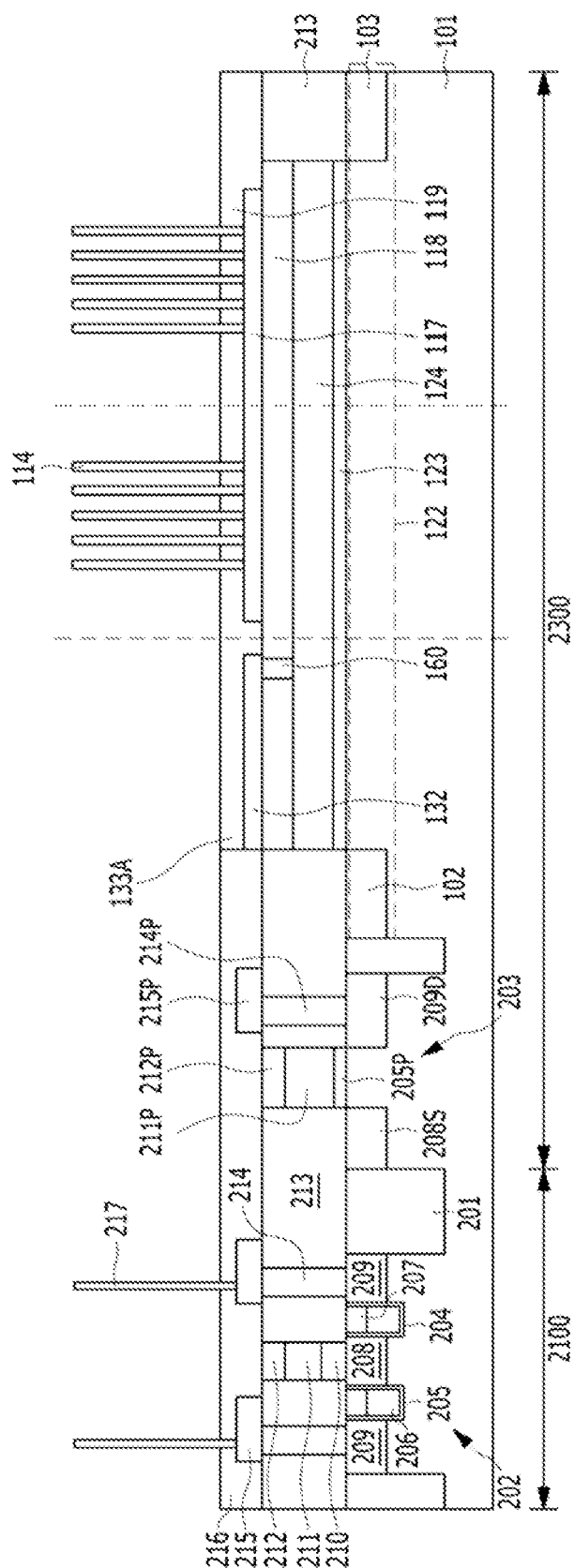

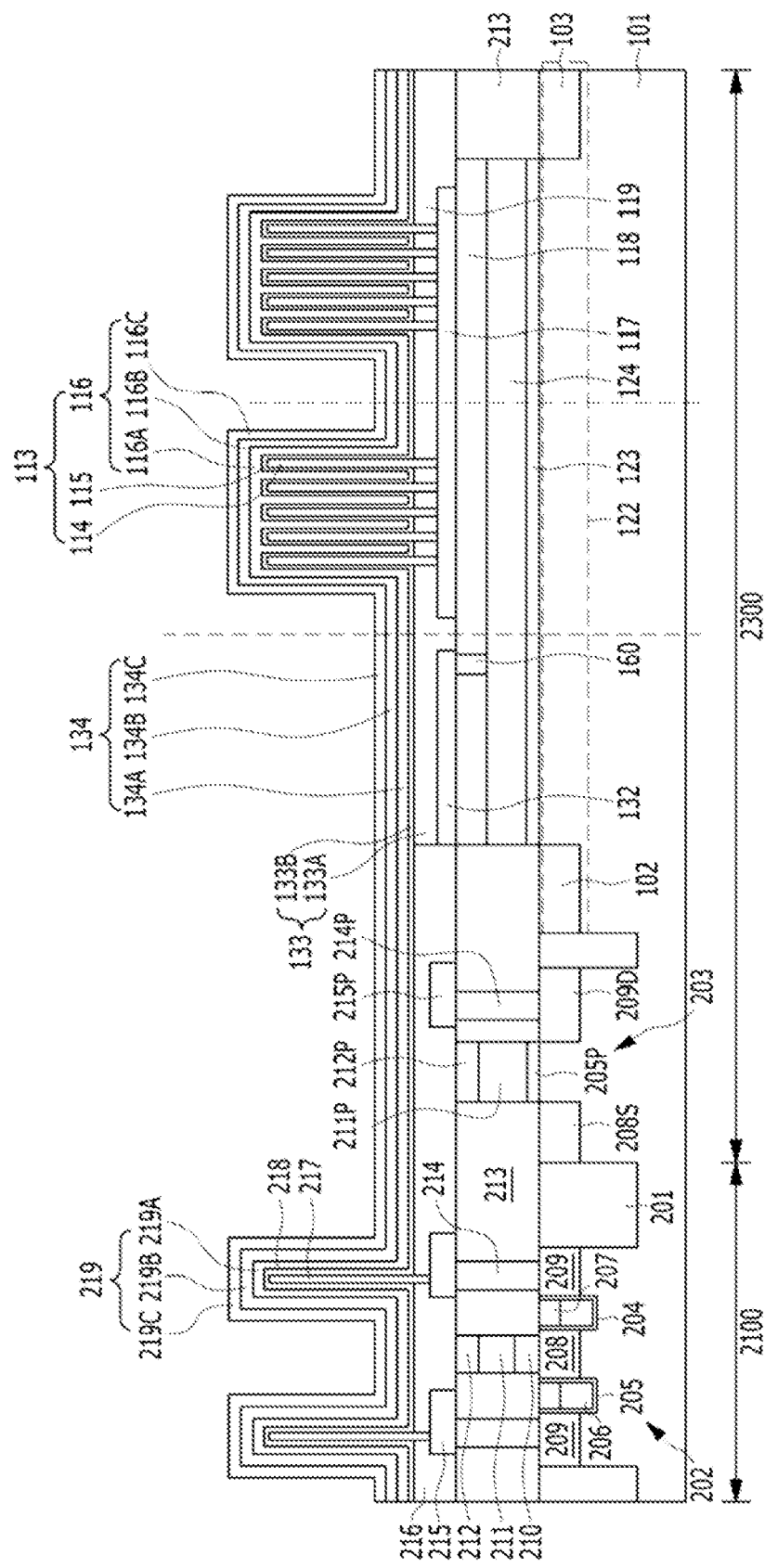

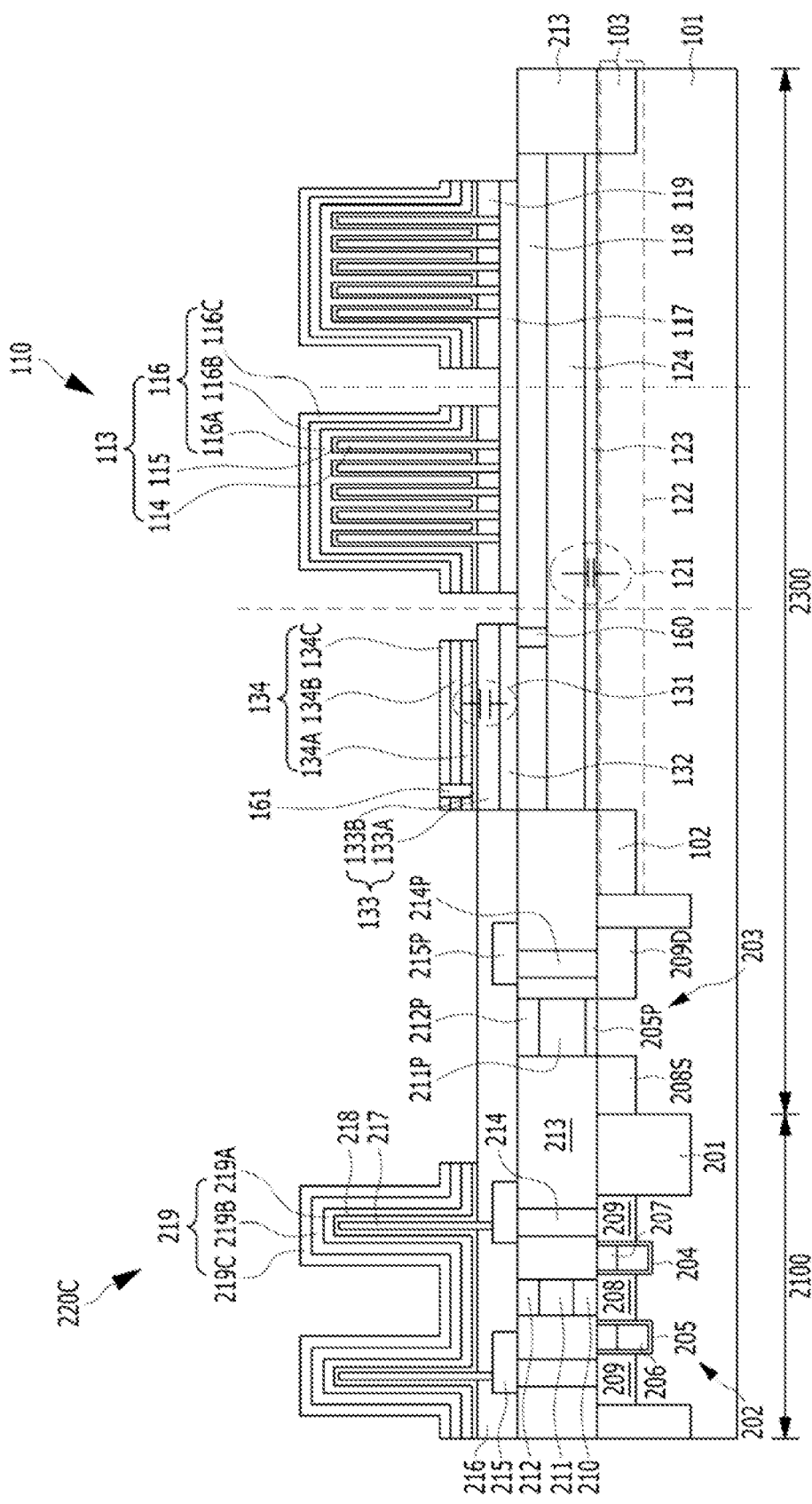

SEMICONDUCTOR DEVICE INCLUDING CAPACITOR AND METHOD FOR MANUFACTURING THE SAME

CROSS-REFERENCE TO RELATED APPLICATION

This application claims priority of Korean Patent Application No. 10-2015-0065181, filed on May 11, 2015, which is herein incorporated by reference in its entirety.

TECHNICAL FIELD

Exemplary embodiments relate to a semiconductor device, and more particularly, to a semiconductor device including a capacitor and a method for manufacturing the same.

DISCUSSION OF THE RELATED ART

Currently, a high performance semiconductor device is required to have high integration, low voltage use and high speed operation. While such semiconductor device requires a low voltage, various levels of power are needed. When power is supplied to a semiconductor device, noise is inevitably generated. Noise changes the signal transfer characteristic, that is, the delay value, of an element.

Recently, a high capacity capacitor for removing noise has been formed in a peripheral circuit region of a semiconductor device.

The high capacity capacitor for removal of noise is configured in an empty space of the peripheral circuit region and is required to secure a larger capacity and provide stable power.

SUMMARY

Various embodiments are directed to a semiconductor device including a high capacity capacitor and a method for manufacturing the same.

In an embodiment, a semiconductor device may include: a semiconductor substrate including a first region and a second region; a first planar type capacitor including a gate electrode and positioned in the first region; a non-planar type capacitor including a plurality of non-planar type electrodes and positioned in the second region; a second planar type capacitor including a planar type electrode, positioned over the first planar type capacitor, and overlapping with the first planar type capacitor; and a common node provided under the non-planar type capacitor.

In an embodiment, a semiconductor device may include: a semiconductor substrate including a cell region and a high capacity capacitor region; a MOS type capacitor including a gate electrode and positioned in the high capacity capacitor region; cell capacitors including a plurality of cell storage nodes and positioned in the cell region; a non-planar type capacitor located at the same level as the cell storage nodes, including a plurality of non-planar type storage nodes, and positioned over the high capacity capacitor region; a MIM type capacitor including a planar type electrode, positioned over the MOS type capacitor, and overlapping with the MOS type capacitor; and a common node under the non-planar type capacitor.

In an embodiment, a method for manufacturing a semiconductor device may include: preparing a substrate which includes a cell region and a high capacity capacitor region, wherein the high capacity capacitor region includes a first region and a second region; forming a first planar type capacitor in the first region of the high capacity capacitor region; forming a second planar type capacitor over the first planar type capacitor; forming a plurality of cell capacitors in the cell region; forming a common node in the second region of the high capacity capacitor region; and forming a plurality of non-planar type capacitors electrically coupled to the common node, wherein the plurality of non-planar type capacitors and the plurality of cell capacitors are formed at the same level. The first planar type capacitor and the second planar type capacitor are electrically coupled to each other in series through an internal plug. The forming of the second planar type capacitor includes sequentially stacking a first planar type electrode, a dielectric layer, and a second planar type electrode, and the first planar type electrode is separated from the common node and formed at the same level as the common node. The forming of the plurality of non-planar type capacitors and the plurality of cell capacitors at the same level includes: forming cell storage nodes and non-planar type storage nodes in the cell region and in the second region of the high capacity capacitor region, respectively; forming a dielectric layer over the cell storage nodes and the non-planar type storage nodes; forming a top electrode layer over the dielectric layer; and etching the top electrode layer to form a top electrode and a non-planar type top electrode in the cell region and the second region of the high capacity capacitor region, respectively. The forming of the second planar type capacitor includes sequentially stacking a first planar type electrode, a dielectric layer and a second planar type electrode, and the forming of the top electrodes and the non-planar type top electrodes, the second planar type electrode of the second planar type capacitor is formed simultaneously.

According to the embodiments, by forming capacitors including a three-dimensional capacitor, a MOS (metal-oxide-silicon) type capacitor and a MIM (metal-insulator-metal) type capacitor, it is possible to form a high capacity capacitor which has a high capacity and a high degree of integration.

Also, according to the embodiments, by forming an internal contact plug to electrically couple the MOS type capacitor and the MIM type capacitor, it is possible to increase the degrees of wiring freedom of the MOS type capacitor and the MIM type capacitor, and to decrease a design rule.

BRIEF DESCRIPTION OF THE DRAWINGS

FIGS. 7A to 7G are cross-sectional views illustrating a method for manufacturing a memory device according to an embodiment.

DETAILED DESCRIPTION

Figure 1A:
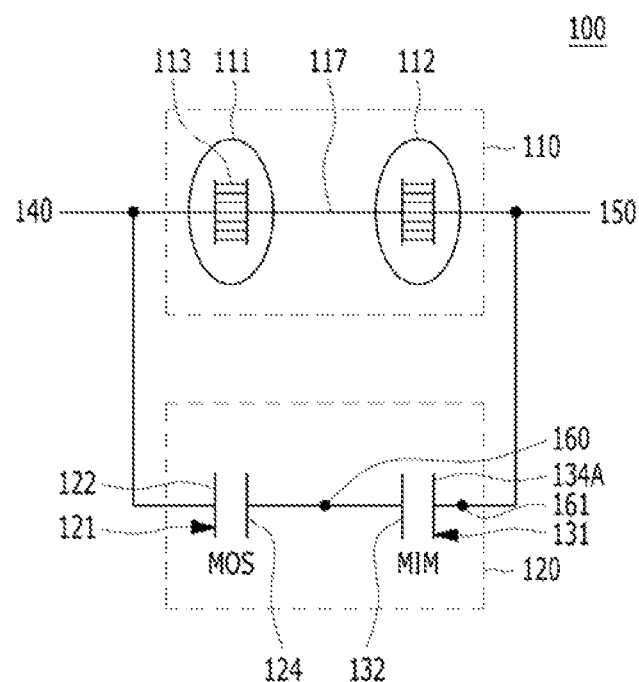
FIG. 1A illustrates an example of a circuit diagram to for a high capacity capacitor in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Figure 1B:
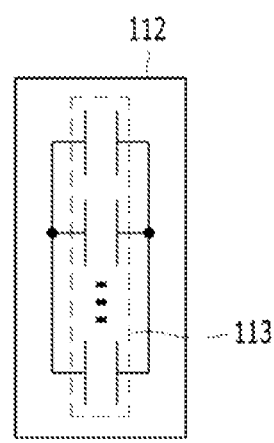
FIG. 1B illustrates the non-planar type capacitor group shown FIG. 1A.
Figure 2:
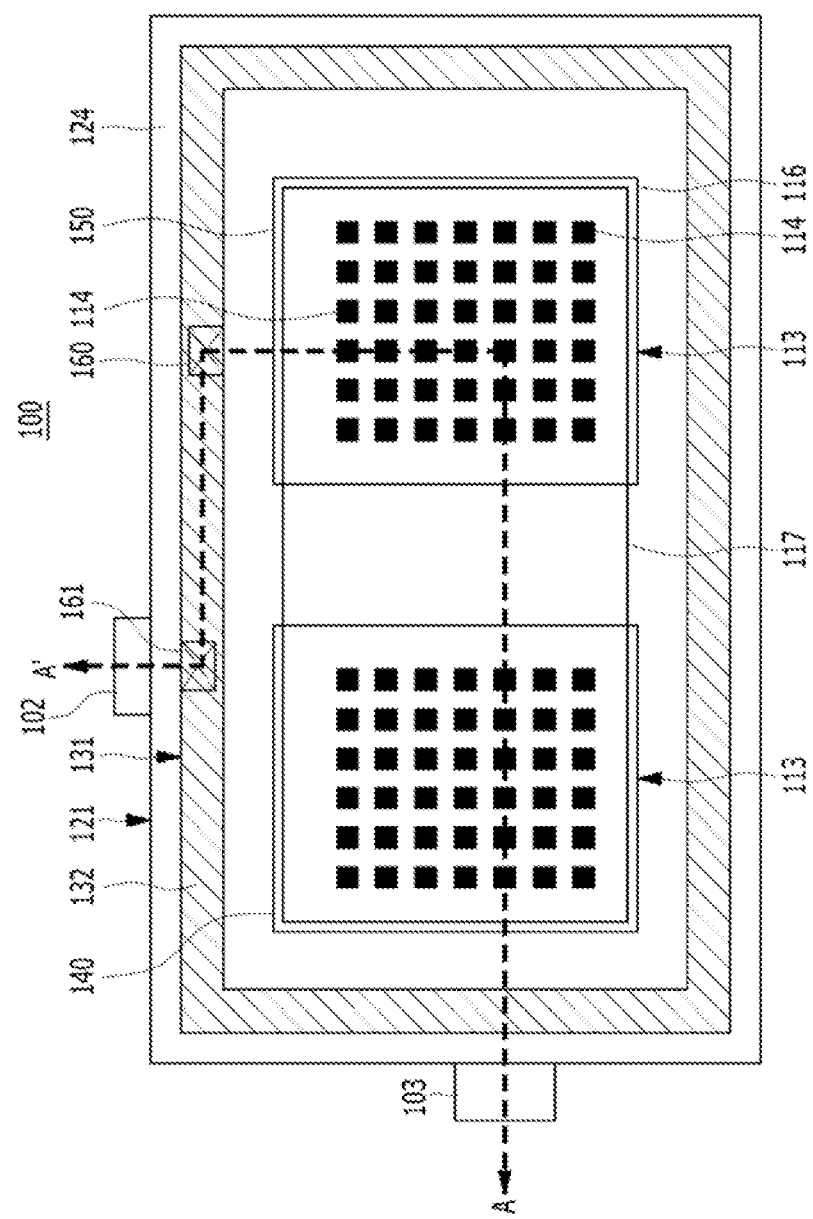
FIG. 2 is a plan view illustrating the high capacity capacitor of FIG. 1.
Figure 3:
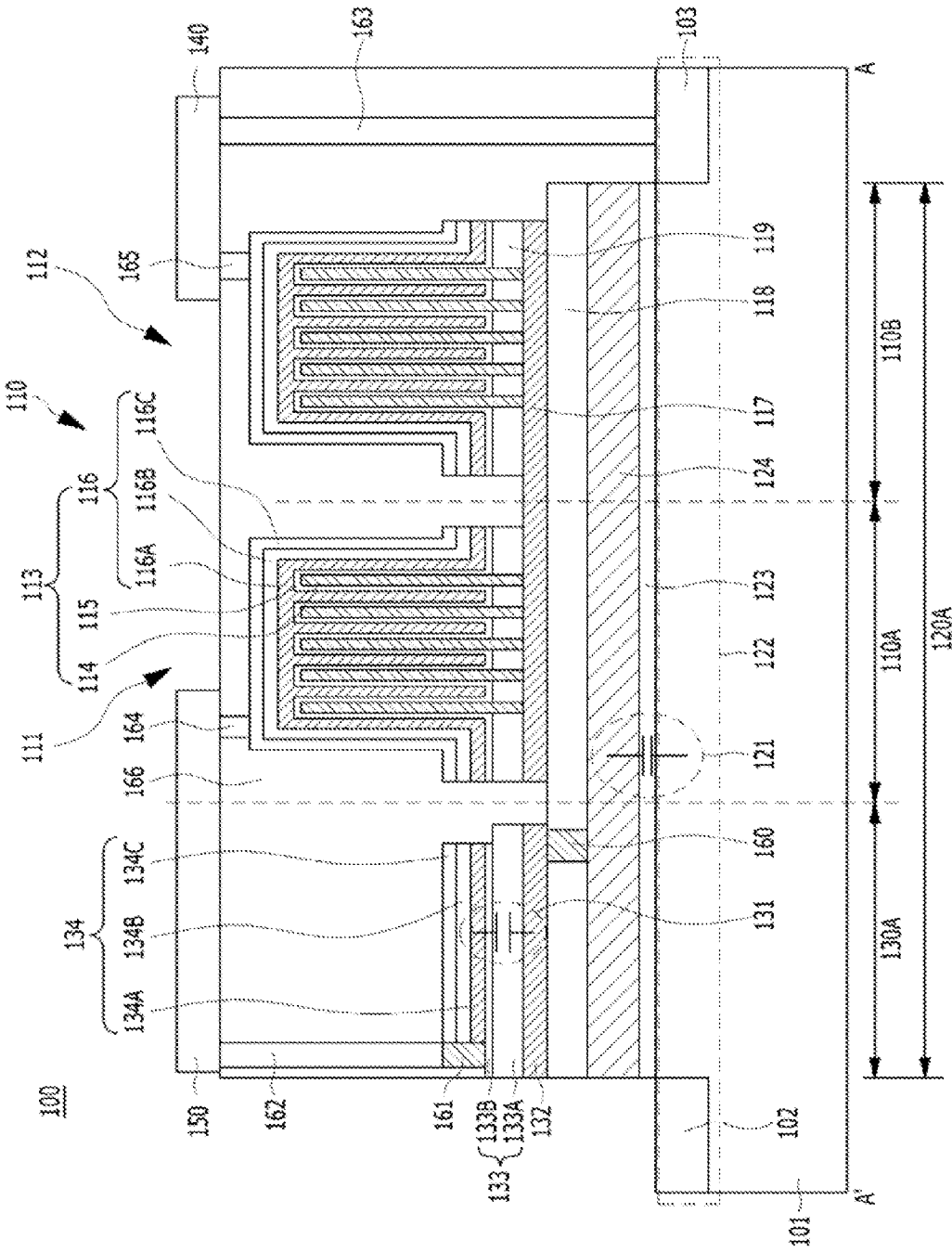
FIG. 3 is a cross-sectional view taken along the line A-A' of FIG. 2 illustrating the high capacity capacitor.

FIG. 1A illustrates a circuit diagram of a high capacity capacitor in accordance with a first embodiment, and FIG. 1B illustrates non-planar type capacitor group of FIG. 1A. FIG. 2 is a plan view illustrating the high capacity capacitor of FIG. 1A. FIG. 3 is a cross-sectional view taken along the line A-A' of FIG. 2, illustrating the high capacity capacitor.

Referring to FIG. 1A and FIG. 1B, a high capacity capacitor 100 may include a first plate 140, a second plate 150, a first capacitor 110, and a second capacitor 120. The first capacitor 110 and the second capacitor 120 may be positioned between the first plate 140 and the second plate 150. The first capacitor 110 and the second capacitor 120 may be electrically coupled in parallel.

The first capacitor 110 may include a first non-planar type capacitor group 111 and a second non-planar type capacitor group 112. The first non-planar type capacitor group 111 and the second non-planar type capacitor group 112 may be electrically coupled in series. The first non-planar type capacitor group 111 and the second non-planar type capacitor group 112 may include a plurality of non-planar type capacitors 113, respectively.

In the first non-planar type capacitor group 111, the plurality of non-planar type capacitors 113 may be electrically coupled in parallel. In the same manner as in the first non-planar type capacitor group 111, in the second non-planar type capacitor group 112, the plurality of non-planar type capacitors 113 may be electrically coupled in parallel. Each of the non-planar type capacitors 113 may be referred to as a capacitor of a three-dimensional structure.

Each of the non-planar type capacitors 113 includes first non-planar type electrodes 114 of a three-dimensional structure. As the surface areas of the first non-planar type electrodes 114 increase, capacitance may increase. In this way, as the non-planar type capacitors 113 of a three-dimensional structure are applied, the capacity of the high capacity capacitor 100 may be maximized.

One end of the first capacitor 110 may be electrically coupled to the first plate 140, and the other end of the first capacitor 110 may be electrically coupled to the second plate 150. The first plate 140 and the second plate 150 may be referred to as a low voltage plate and a high voltage plate, respectively. That is, predetermined voltages may be respectively applied such that a potential difference is induced between the first plate 140 and the second plate 150.

The second capacitor 120 may include a plurality of planar type capacitors. Each of the planar type capacitors may be referred to as a capacitor with a planar-shaped electrode. For example, the second capacitor 120 may include a first planar type capacitor 121 and a second planar type capacitor 131. The first planar type capacitor 121 may be a MOS (metal-oxide-silicon) capacitor, and the second planar type capacitor 131 may be a MIM (metal-insulator-metal) capacitor.

One end of the second capacitor 120 may be electrically coupled to the first plate 140, and the other end of the second capacitor 120 may be electrically coupled to the second plate 150. For example, the first planar type capacitor 121 and the second planar type capacitor 131 may be electrically coupled in series between the first plate 140 and the second plate 150.

The first planar type capacitor 121 and the second planar type capacitor 131 may be positioned vertically. That is, the second planar type capacitor 131 may be positioned over the first planar type capacitor 121. Thus, an area to be occupied by the second planar type capacitor 131 in the high capacity capacitor 100 may be reduced.

As described above, since the high capacity capacitor 100 includes the first capacitor 110 which includes the plurality of non-planar type capacitors 113 and the second capacitor 120 which includes the first and second planar type capacitors 121 and 131, capacity may be increased.

Referring to FIG. 2, the second planar type capacitor 131 may be a ring shape. That is, the second planar type capacitor 131 may have a shape which surrounds the first capacitor 110.

The first non-planar type capacitor group 111 and the second non-planar type capacitor group 112 may be formed independently from each other and separated from each other. As will be described later, the first non-planar type capacitor group 111 and the second non-planar type capacitor group 112 may be electrically coupled to each other through a common node 117. Also, the first non-planar type capacitor group 111 and the second non-planar type capacitor group 112 may be formed simultaneously. The first planar type capacitor 121 may be formed over the entire region of a substrate 101.

Referring to FIG. 3, the high capacity capacitor 100 may be formed on the substrate 101. The substrate 101 may include a first region 120A, a second region 130A, a third region 110A, and a fourth region 110B. The first region 120A may be a region where the first planar type capacitor 121 is formed. The second region 130A may be a region where the second planar type capacitor 131 is formed. The third region 110A and the fourth region 110B may be regions where the first capacitor 110 is formed. The second region 130A, the third region 110A and the fourth region 110B may overlap with the first region 120A. The first region 120A has a largest area, and each of the second region 130A, the third region 110A and the fourth region 110B have an area smaller than the first region 120A.

The substrate 101 may be formed of a material appropriate for processing a semiconductor. For example, the substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may include another semiconductor material such as germanium. The substrate 101 may include a III/V group semiconductor substrate, for example, a compound semiconductor substrate such as GaAs. The substrate 101 may include a silicon-on-insulator (SOI) substrate. An active region 122 may be defined in the substrate 101. The active region 122 may include a first doping region 102 and a second doping region 103.

The first capacitor 110 may include the first non-planar type capacitor group 111 and the second non-planar type capacitor group 112. Each of the first non-planar type capacitor group 111 and the second non-planar type capacitor group 112 may include the plurality of non-planar type capacitors 113. Each non-planar type capacitor 113 may include the plurality of first non-planar type electrodes 114, a dielectric layer 115, and a second non-planar type electrode 116. The plurality of first non-planar type electrodes 114 may be electrically coupled to the common node 117.

In each non-planar type capacitor 113, the second non-planar type electrode 116 may overlap with the plurality of first non-planar type electrodes 114. The dielectric layer 115 may be positioned between the second non-planar type electrode 116 and the first non-planar type electrodes 114. The first non-planar type capacitor group 111 and the second non-planar type capacitor group 112 may share the common node 117.

The second non-planar type electrode 116 may have a stack structure which includes a first layer 116A, a second layer 116B and a third layer 116C. The first layer 116A may include titanium nitride (TiN), the second layer 116B may include silicon germanium (SiGe), and the third layer 116C may include tungsten. Accordingly, the second non-planar type electrode 116 may have the stack structure of W/SiGe/TiN. The first non-planar type electrodes 114 may include titanium nitride.

The dielectric layer 115 may include a high-k material. The high-k material may include a material which has a dielectric constant larger than the dielectric constant of silicon oxide. For example, the high-k material may include a material which has a dielectric constant larger than 3.9. For another example, the high-k material may include a material which has a dielectric constant larger than 10. For still another example, the high-k material may include a material which has a dielectric constant of 10 to 30.

The high-k material may include at least one metallic element. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. Other high-k materials known in the art may be selectively used as the high-k material. In an embodiment, the dielectric layer 115 may have a ZAZ ($ZrO_2/Al_2O_3/ZrO_2$) structure.

The common node 117 may include a metallic material, polysilicon, or a combination thereof. For example, the common node 117 may include tungsten. Each of the first non-planar type electrodes 114 may have a pillar shape. In such structure, each non-planar type capacitor 113 has an increased surface area, and thus capacitance may increase.

The bottom portions of the first non-planar type electrodes 114 may be secured to an etch stop layer 119. That is, the bottom portions of the first non-planar type electrodes 114 may pass through the etch stop layer 119 to be electrically coupled to the common node 117. The etch stop layer 119 may include a dielectric material. The etch stop layer 119 may include silicon nitride.

The first planar type capacitor 121 may include a first electrode, a dielectric layer, and a second electrode. For example, the first planar type capacitor 121 may include the active region 122, a gate dielectric layer 123, and a gate electrode 124. The active region 122 plays the role of the first electrode, and the gate electrode 124 plays the role of the second electrode. The active region 122 may be doped with impurities to have conductivities.

The gate electrode 124 may include a metallic material, polysilicon, or a combination thereof. The gate dielectric layer 123 may include silicon oxide, silicon nitride, silicon oxynitride, a high-k material, or a combination thereof. The high-k material used as the gate dielectric layer 123 may be the same as the dielectric layer 115.

A protective layer 118 may be formed on the gate electrode 124 of the first planar type capacitor 121. The protective layer 118 may include a dielectric material. For example, the protective layer 118 may include silicon nitride or silicon oxide. The protective layer 118 may overlap with the gate electrode 124. That is, the protective layer 118 may have a planar shape which is the same as the gate electrode 124. The protective layer 118 may be positioned between the common node 117 and the gate electrode 124.

First and second doping regions 102 and 103 may be formed in the active region 122 on both sides of the gate electrode 124. The first and second doping regions 102 and 103 may be doped with impurities. The gate electrode 124 may be a planar shape.

The second planar type capacitor 131 may include a first planar type electrode 132, a dielectric layer 133, and a second planar type electrode 134. The first planar type electrode 132 of the second planar type capacitor 131 may be located at the same level as the common node 117. The second planar type electrode 134 of the second planar type capacitor 131 may be located at the same level as the second non-planar type electrode 116 of the non-planar type capacitor 113.

The first planar type electrode 132 of the second planar type capacitor 131 may include a metallic material, polysilicon, or a combination thereof. For example, the first planar type electrode 132 of the second planar type capacitor 131 may include tungsten. The second planar type electrode 134 of the second planar type capacitor 131 may have a stack structure which includes a first layer 134A, a second layer 134B and a third layer 134C. The first layer 134A may include titanium nitride (TiN), the second layer 134B may include silicon germanium (SiGe), and the third layer 134C may include tungsten. Accordingly, the second planar type electrode 134 may have the stack structure of W/SiGe/TiN.

A part of the dielectric layer 133 of the second planar type capacitor 131 may be the same as the dielectric layer 115 of the non-planar type capacitor 113. The dielectric layer 133 of the second planar type capacitor 131 may include the stack of a first dielectric layer 133A and a second dielectric layer 133B. The second dielectric layer 133B may be the same as the dielectric layer 115 of the non-planar type capacitor 113. The first dielectric layer 133A may be the same level as the etch stop layer 119. The first dielectric layer 133A and the etch stop layer 119 may be formed of the same material. The first dielectric layer 133A may be formed of silicon nitride. The first planar type electrode 132 of the second planar type capacitor 131 and the common node 117 may be insulated from each other.

The gate electrode 124 of the first planar type capacitor 121 and the first planar type electrode 132 of the second planar type capacitor 131 may be electrically coupled with each other by a first internal plug 160. The second planar type electrode 134 of the second planar type capacitor 131 may be electrically coupled to a second internal plug 161. The second planar type electrode 134 of the second planar type capacitor 131 and the second plate 150 may be electrically coupled with each other by the second internal plug 161 and a first contact plug 162. The active region 122 of the first planar type capacitor 121 and the first plate 140 may be electrically coupled with each other by a second contact plug 163. The second plate 150 and the second non-planar type electrode 116 of the non-planar type capacitor 113 may be electrically coupled with each other by a third contact plug 164. The first plate 140 and the second non-planar type electrode 116 of another non-planar type capacitor 113 may be electrically coupled with each other by a fourth contact plug 165.

The first internal plug 160 and the second internal plug 161 may be referred to as double layer contacts (DLC). For example, the gate electrode 124, the protective layer 118 and the first planar type electrode 132 of the second planar type capacitor 131 may contact the first internal plug 160. The second planar type electrode 134 and the second dielectric layer 133B of the second planar type capacitor 131 may contact the second internal plug 161.

By forming the first internal plug 160 and the second internal plug 161, the first planar type capacitor 121 and the second planar type capacitor 131 may be electrically coupled with each other. Further, the second planar type capacitor 131 and the second plate 150 may be electrically coupled in series with each other by the second internal plug 161. By forming the first internal plug 160 and the second internal plug 161, routability of the first planar type capacitor 121 and the second planar type capacitor 131 may increase. Moreover, since it is possible to stack the second planar type capacitor 131 on the first planar type capacitor 121, the area occupied by the high capacity capacitor 100 may be reduced.

The first contact plug 162 and the third contact plug 164 may be electrically coupled to the second plate 150, and the second contact plug 163 and the fourth contact plug 165 may be electrically coupled to the first plate 140. The first plate 140 and the second plate 150 may be the same level. The first contact plug 162, the second contact plug 163, the third contact plug 164 and the fourth contact plug 165 may be located at the same level. The first internal plug 160, the second internal plug 161, the first contact plug 162, the second contact plug 163, the third contact plug 164 and the fourth contact plug 165 may be formed of a metal-containing material. For example, they may be formed of tungsten.

As described above, since the high capacity capacitor 100 in accordance with the first embodiment includes the non-planar type capacitors 113, the first planar type capacitor 121 and the second planar type capacitor 131, capacitance may be maximized.

Figure 4:
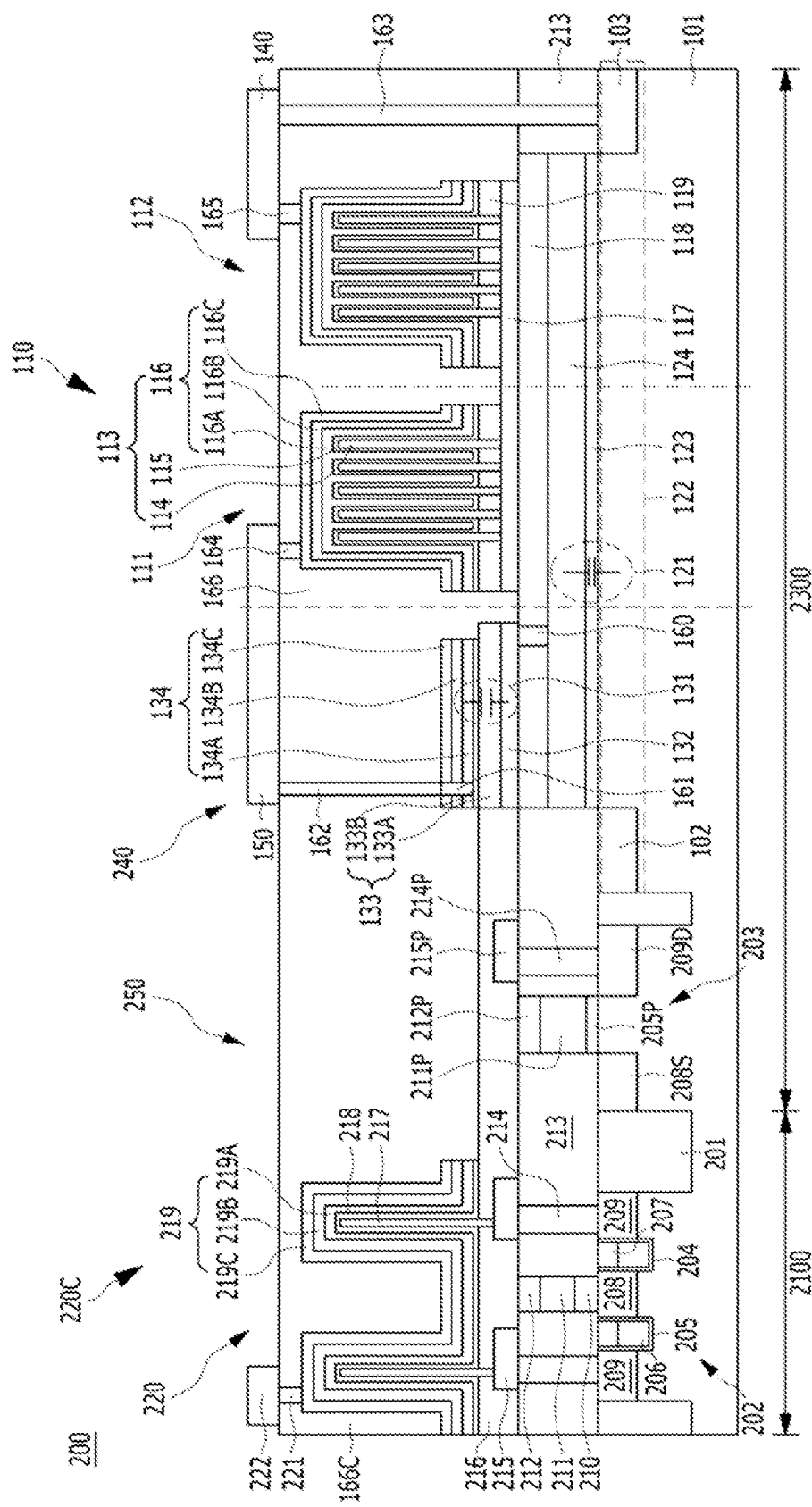
FIG. 4 is a cross-sectional view illustrating a memory device including the high capacity capacitor in accordance with the first embodiment.

FIG. 4 is a cross-sectional view illustrating a representation of an example of a memory device including the high capacity capacitor in accordance with the first embodiment.

Referring to FIG. 4, a memory device 200 may include a memory cell 220, a high capacity capacitor 240, and a peripheral transistor 250. The memory cell 220 may be formed in a cell region 2100, and the high capacity capacitor 240 and the peripheral transistor 250 may be formed in a peripheral circuit region 2300. The cell region 2100 is a region where a plurality of memory cells is formed. The peripheral circuit region 2300 may include a column decoder, a row decoder, a sense amplifier and a control unit to control the operations of memory cells. The control unit may include a power circuit unit, and the power circuit unit may include the high capacity capacitor 240 to stably provide a large amount of current and/or a high voltage to memory cells.

A substrate 101 may include the cell region 2100 and the peripheral circuit region 2300. The cell region 2100 and the peripheral circuit region 2300 may be isolated from each other by an isolation layer 201. The peripheral transistor 250 and the high capacity capacitor 240 may be isolated from each other by the isolation layer 201.

The memory cell 220 will be described below in detail. First, the isolation layer 201 is formed in the substrate 101. A plurality of cell active regions 202 and a peripheral active region 203 are defined by the isolation layer 201. Gate trenches 204 are formed to extend across the cell active regions 202. A buried word line structure is buried in each gate trench 204.

The buried word line structure may include a cell gate dielectric layer 205, a buried word line 206 and a sealing layer 207. A first impurity region 208 and a second impurity region 209 are formed in the substrate 101 on both sides of the buried word line structure. The buried word line 206, the first impurity region 208 and the second impurity region 209, in combination, may form a cell transistor.

A bit line structure which is electrically coupled to the first impurity region 208 may be formed. The bit line structure includes a bit line 211 and a bit line hard mask layer 212. The bit line structure may further include a bit line contact plug 210 between the bit line 211 and the first impurity region 208.

A first interlayer dielectric layer 213 is formed on the substrate 101. The bit line contact plug 210 may be electrically coupled to the first impurity region 208 by passing through the first interlayer dielectric layer 213. The line widths of the bit line contact plug 210 and the bit line 211 may be the same. The bit line 211 may have a line shape which extends in a direction crossing with a direction in which the buried word line 206 extends. The bit line 211 may include polysilicon, metal silicide, metal nitride, a metal, or a combination thereof. The bit line hard mask layer 212 may include silicon oxide or silicon nitride. The bit line contact plug 210 may include polysilicon, metal silicide, metal nitride, a metal, or a combination thereof.

A cell capacitor 220C may be formed on the second impurity region 209. A storage node contact plug 214 and a storage node contact pad 215 may be formed between the cell capacitor 220C and the second impurity region 209. The storage node contact plug 214 may be electrically coupled to the second impurity region 209 by passing through the first interlayer dielectric layer 213. The storage node contact pad 215 may be formed on the storage node contact plug 214. The storage node contact plug 214 may include polysilicon, a metal, metal silicide, metal nitride, or a combination thereof. For example, in the storage node contact plug 214, polysilicon, metal silicide and a metal may be stacked. The storage node contact pad 215 may include a metal.

An etch stop layer 216 may be formed on the storage node contact pad 215. The etch stop layer 216 may include silicon nitride.

The cell capacitor 220C may include a bottom electrode 217, a dielectric layer 218, and a top electrode 219. The bottom electrode 217 may have a pillar shape, and may be electrically coupled to the storage node contact pad 215 by passing through the etch stop layer 216.

The top electrode 219 may have a stack structure which includes a first top electrode 219A, a second top electrode 219B and a third top electrode 219C. The first top electrode 219A may include titanium nitride (TiN), the second top electrode 219B may include silicon germanium (SiGe), and the third top electrode 219C may include tungsten. Accordingly, the top electrode 219 may have the stack structure of W/SiGe/TiN. The bottom electrode 217 may include titanium nitride.

The dielectric layer 218 may include a high-k material. The high-k material may include a material which has a dielectric constant larger than the dielectric constant of silicon oxide. For example, the high-k material may include a material which has a dielectric constant larger than 3.9. For another example, the high-k material may include a material which has a dielectric constant larger than 10. For still another example, the high-k material may include a material which has a dielectric constant of 10 to 30.

The high-k material may include at least one metallic element. The high-k material may include a hafnium-containing material. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, or a combination thereof. As the high-k material, other high-k materials known in the art may be selectively used. In the present embodiment, the dielectric layer 218 may have a ZAZ ($ZrO_2/Al_2O_3/ZrO_2$) structure.

The peripheral transistor 250 may include a peripheral gate dielectric layer 205P, a peripheral gate electrode 211P, a source region 208S, and a drain region 209D. The peripheral gate electrode 211P may be at the same level as the bit line 211. A peripheral gate hard mask layer 212P may be formed on the peripheral gate electrode 211P. The peripheral gate hard mask layer 212P may be at the same level as the bit line hard mask layer 212. In this way, the peripheral gate electrode 211P and the bit line 211 may be formed simultaneously.

A metal contact plug 214P may be electrically coupled to the drain region 209D, and a first metal line 215P may be formed on the metal contact plug 214P. The first metal line 215P may be at the same level as the storage node contact pad 215. The first metal line 215P and the storage node contact pad 215 may be formed simultaneously.

The high capacity capacitor 240 may be at the same as the high capacity capacitor 100 shown in FIG. 3. The first non-planar type capacitor group 111 and the second non-planar type capacitor group 112 of the high capacity capacitor 240 may be at the same level as the cell capacitor 220C. The non-planar type capacitor 113 and the cell capacitor 220C may be formed simultaneously. The non-planar type capacitors 113 of the high capacity capacitor 240 contribute to power voltage stabilization.

In this way, while the cell capacitor 220C of the memory cell 220 and the non-planar type capacitor 113 of the high capacity capacitor 240 have different functions, these capacitors are formed simultaneously through the same or similar processes.

A second interlayer dielectric layer 166C may be formed in the cell region 2100 in which the cell capacitor 220C is formed. The second interlayer dielectric layer 166C may be at the same level as an interlayer dielectric layer 166 of the high capacity capacitor 240.

As described above, the cell capacitor 220C and the non-planar type capacitor 113 of the high capacity capacitor 240 may have a pillar-shaped structure and may be formed simultaneously through the same processes. Therefore, the top electrode 219 of the cell capacitor 220C and the second non-planar type electrode 116 of the non-planar type capacitor 113 may be formed simultaneously through the same processes. The second non-planar type electrode 116 of the non-planar type capacitor 113 may be formed by etching an extended portion of the top electrode 219, that is, a portion of the top electrode 219 which extends to the peripheral circuit region 2300. Further, the second planar type electrode 134 of the second planar type capacitor 131 may be formed by etching a portion of the top electrode 219.

The gate electrode 124 of the first planar type capacitor 121 and the peripheral gate electrode 211P of the peripheral transistor 250 may be at the same level.

Figure 5:
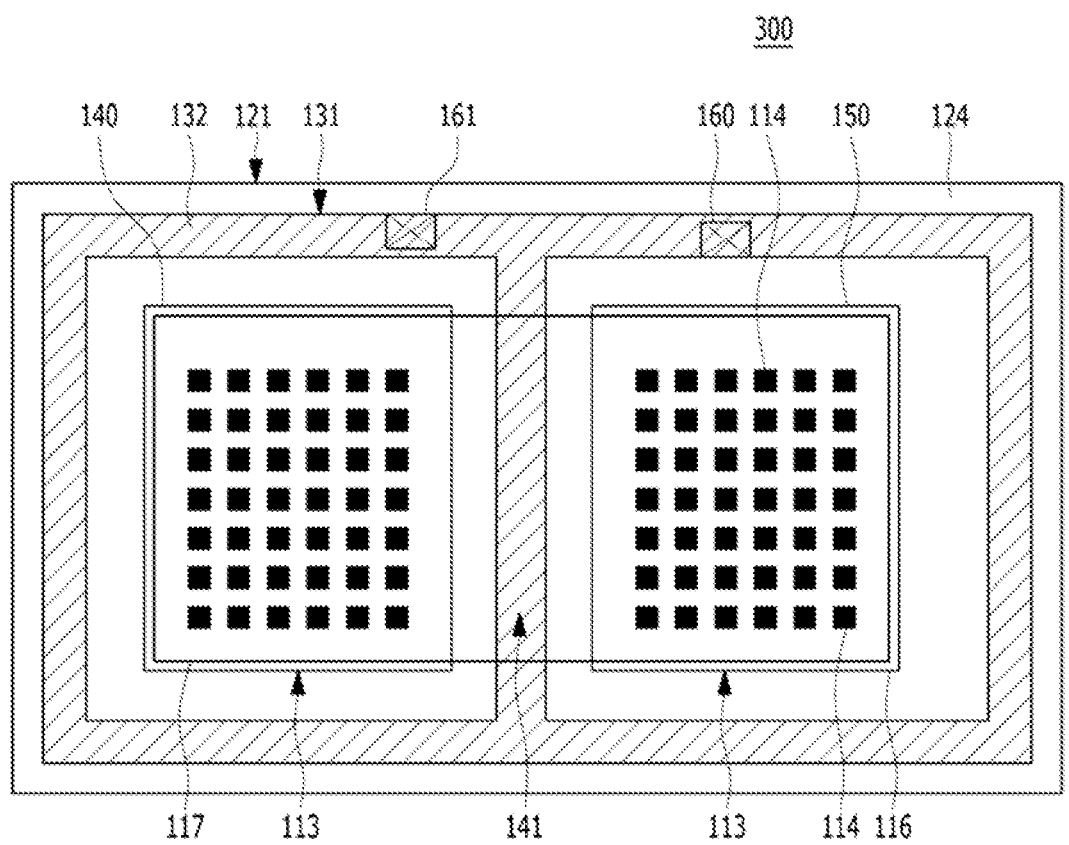
FIG. 5 is a plan view illustrating a high capacity capacitor in accordance with a second embodiment.

FIG. 5 is a plan view illustrating a high capacity capacitor in accordance with a second embodiment. A high capacity capacitor 300 in accordance with the second embodiment may be similar to the high capacity capacitor 100 in accordance with the first embodiment. However, in the high capacity capacitor 300 in accordance with the second embodiment, a portion of the second planar type capacitor 131 may extend between the first non-planar type capacitor group 111 and the second non-planar type capacitor group 112. For example, an extended part 141 of the second planar type capacitor 131 may be positioned between the first non-planar type capacitor group 111 and the second non-planar type capacitor group 112.

Figure 6:
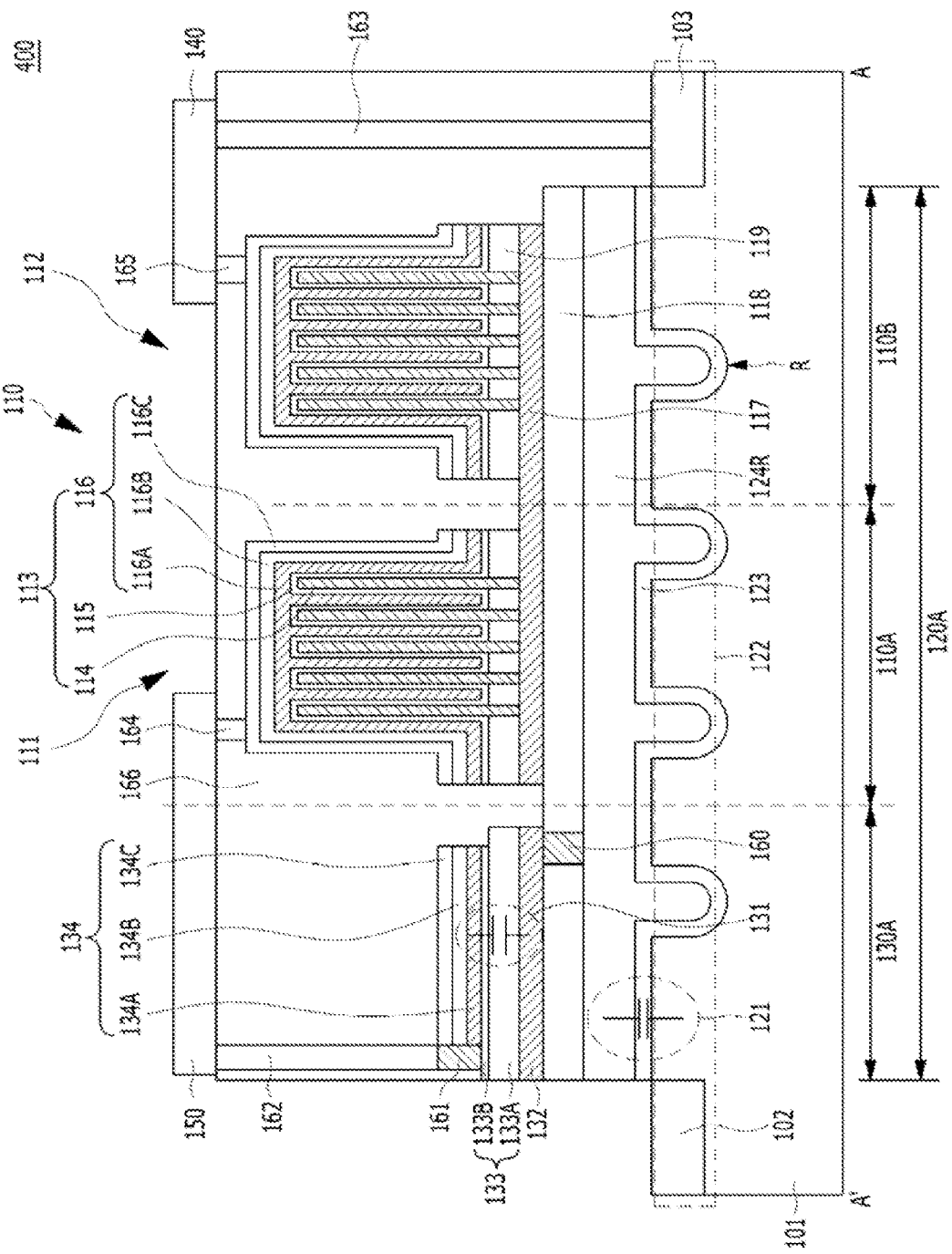
FIG. 6 is a cross-sectional view illustrating a high capacity capacitor in accordance with a third embodiment.

FIG. 6 is a cross-sectional view illustrating a high capacity capacitor in accordance with a third embodiment. A high capacity capacitor 400 in accordance with the third embodiment may be similar to the high capacity capacitor 100 in accordance with the first embodiment. However, in the high capacity capacitor 400 in accordance with the third embodiment, the gate electrode of the first planar type capacitor 121 may have a recess gate structure.

For example, a plurality of recesses R having a predetermined depth are formed on the surface of the substrate 101, and recessed gate electrodes 124R may be formed in the plurality of recesses R. The recessed gate electrode 124R may have a shape which fills the recess R and extends over the surface of the substrate 101. As the recessed gate electrode 124R is formed in this way, the capacitance of the first planar type capacitor 121 may be further increased.

The high capacity capacitor 400 in accordance with the third embodiment may be modified as shown in FIG. 5. For example, an extended part 141 of the second planar type capacitor 131 may be positioned between the first non-planar type capacitor group 111 and the second non-planar type capacitor group 112.

FIGS. 7A to 7G are cross-sectional views illustrating a method for manufacturing a memory device to which the embodiments are applied. Hereafter, a method for manufacturing the memory device 200 shown in FIG. 4 will be described as an example.

Figure 7A:
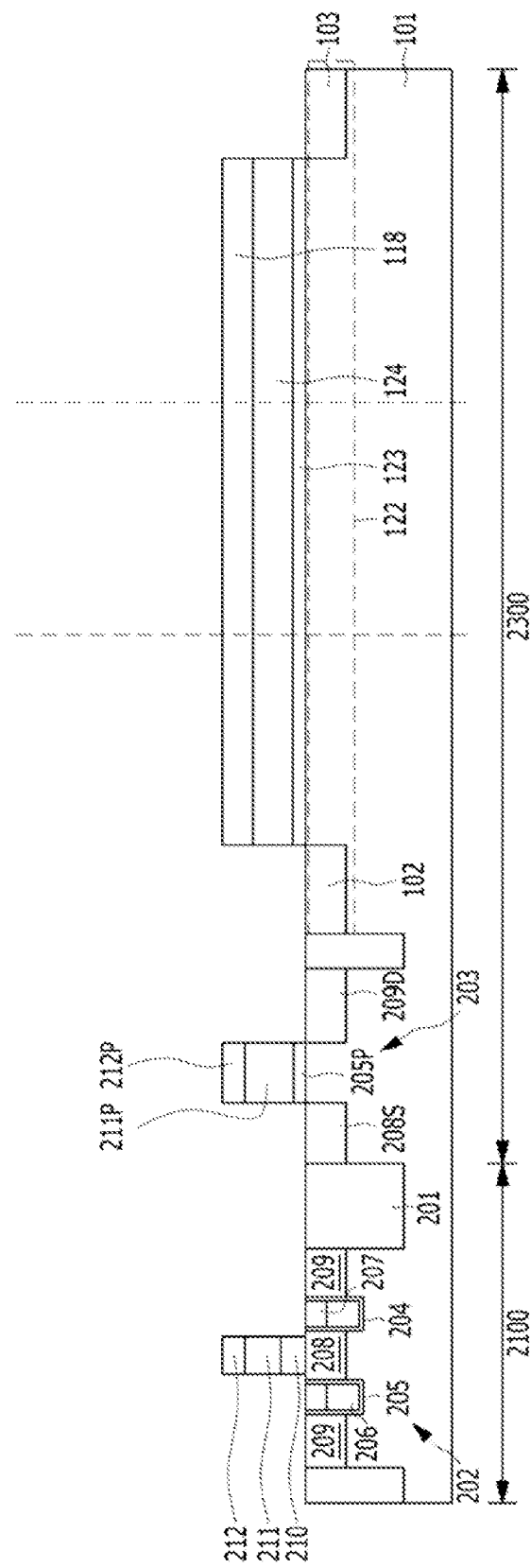

As shown in FIG. 7A, an isolation layer 201 is formed in a substrate 101. The substrate 101 includes a semiconductor material. The substrate 101 may include a silicon substrate, a silicon germanium substrate or a silicon-on-insulator (SOI) substrate. The isolation layer 201 may be formed through a shallow trench isolation (STI) process. The isolation layer 201 is formed in isolation trenches.

A cell active region 202 and a peripheral active region 203 may be defined by the isolation layer 201. The cell active region 202 may be an island type. A plurality of cell active regions 202 are isolated by the isolation layer 201. The isolation layer 201 may be formed of silicon nitride, silicon oxide, or a combination thereof. The substrate 101 may include a cell region 2100 and a peripheral circuit region 2300.

A transistor including a buried word line 206 is formed in the cell region 2100. The buried word line 206 is buried in the substrate 101. The buried word line 206 is formed in a gate trench 204. The gate trench 204 having a predetermined depth is formed in the substrate 101.

The gate trench 204 may be a line type which extends in any one direction. The gate trench 204 may be formed by etching the cell active region 202 and the isolation layer 201. The gate trench 204 may be a type which extends across the cell active region 202 and the isolation layer 201. One portion of the gate trench 204 may be formed in the cell active region 202, and the other portion of the gate trench 204 may be formed in the isolation layer 201. In another embodiment, a part of the gate trench 204, that is, the portion of the gate trench 204 which is formed in the isolation layer 201 may have a depth deeper than the portion of the gate trench 204 which is formed in the cell active region 202 as a fin structure.

A cell gate dielectric layer 205 may be formed on the surface of the gate trench 204. The cell gate dielectric layer 205 may be formed through thermal oxidation. In another embodiment, the cell gate dielectric layer 205 may be formed through chemical vapor deposition (CVD) or atomic layer deposition (ALD). The cell gate dielectric layer 205 may be formed of a high-k material, oxide, nitride, oxynitride, or a combination thereof. The high-k material may be a dielectric material which has a dielectric constant higher than the dielectric constants of oxide and nitride. For example, the high-k material may include metal oxide such as hafnium oxide ($HfO_2$), hafnium silicate (HfSiO) and hafnium silicate nitride (HfSiON).

The buried word line 206 is formed on the cell gate dielectric layer 205. A sealing layer 207 is formed on the buried word line 206. The buried word line 206 may be formed at a lower level than an upper surface of the substrate 101. The buried word line 206 may be formed by forming a metal-containing layer to gapfill the gate trench 204 and then etching back the metal-containing layer. The metal-containing layer may include a metal-base material. The metal-containing material may include a metal such as titanium, tantalum and tungsten. The metal-containing layer may include tantalum nitride (TaN), titanium nitride (TiN), tungsten nitride (WN), tungsten (W), or a combination thereof. For example, the buried word line 206 may be formed into a double-layered structure such as TiN/W in which tungsten (W) is stacked on titanium nitride (TiN). In another embodiment, the buried word line 206 may include a work function metal layer.

The sealing layer 207 fills the gate trench 204 on the buried word line 206. The sealing layer 207 may play the role of protecting the buried word line 206 from a subsequent process. The sealing layer 207 may include a dielectric material. The sealing layer 207 may include silicon nitride, silicon oxide, or a combination thereof.

After forming the sealing layer 207, a first impurity region 208 and a second impurity region 209 may be formed in the cell active region 202. The first impurity region 208 and the second impurity region 209 may be referred to as a source region and a drain region, respectively. As such, a buried gate type transistor including the buried word line 206 is formed. The first impurity region 208 and the second impurity region 209 may be formed through a doping process such as implantation. The first impurity region 208 and the second impurity region 209 may be doped with impurities of the same conductivity type, for example, an N type.

Next, a bit line contact plug 210 is formed on the substrate 101. The bit line contact plug 210 may be formed in a first contact hole (not shown). The first contact hole may be formed by etching a first interlayer dielectric layer (not shown).

A bit line 211 and a bit line hard mask layer 212 may be stacked on the bit line contact plug 210. The bit line 211 may be formed of a metal-containing material. The bit line 211 may include a metal, metal nitride, metal silicide, or a combination thereof. In an embodiment, the bit line 211 may include tungsten (W) or the stack of titanium nitride and tungsten (TiN/W).

The bit line 211 may be formed by stacking a barrier layer and a metal layer. The bit line hard mask layer 212 is formed of a dielectric material. The bit line hard mask layer 212 may include silicon oxide or silicon nitride. In the present embodiment, the bit line hard mask layer 212 may be formed of silicon nitride.

While forming the bit line 211 and the bit line hard mask layer 212, a peripheral transistor and a part of a first planar type capacitor may be formed in the peripheral circuit region 2300. For example, a gate electrode 124 of the first planar type capacitor may be formed together with the bit line 211. A protective layer 118 may be formed on the gate electrode 124. The protective layer 118 may be at the same level as the bit line hard mask layer 212.

A peripheral gate electrode 211P of the peripheral transistor may be formed together with the bit line 211. A peripheral gate hard mask layer 212P may be formed on the peripheral gate electrode 211P. As described above, the bit line 211, the peripheral gate electrode 211P and the gate electrode 124 of the first planar type capacitor may be formed simultaneously.

After forming the gate electrode 124 and the protective layer 118, a first doping region 102 and a second doping region 103 may be formed in the substrate 101 in the peripheral circuit region 2300. The first doping region 102 and the second doping region 103 may be doped with N type impurities. The first doping region 102 and the second doping region 103 may be referred to as a source region and a drain region, respectively. While forming the first and second doping regions 102 and 103, a source region 208S and a drain region 209D of the peripheral transistor may be formed.

Figure 7B:
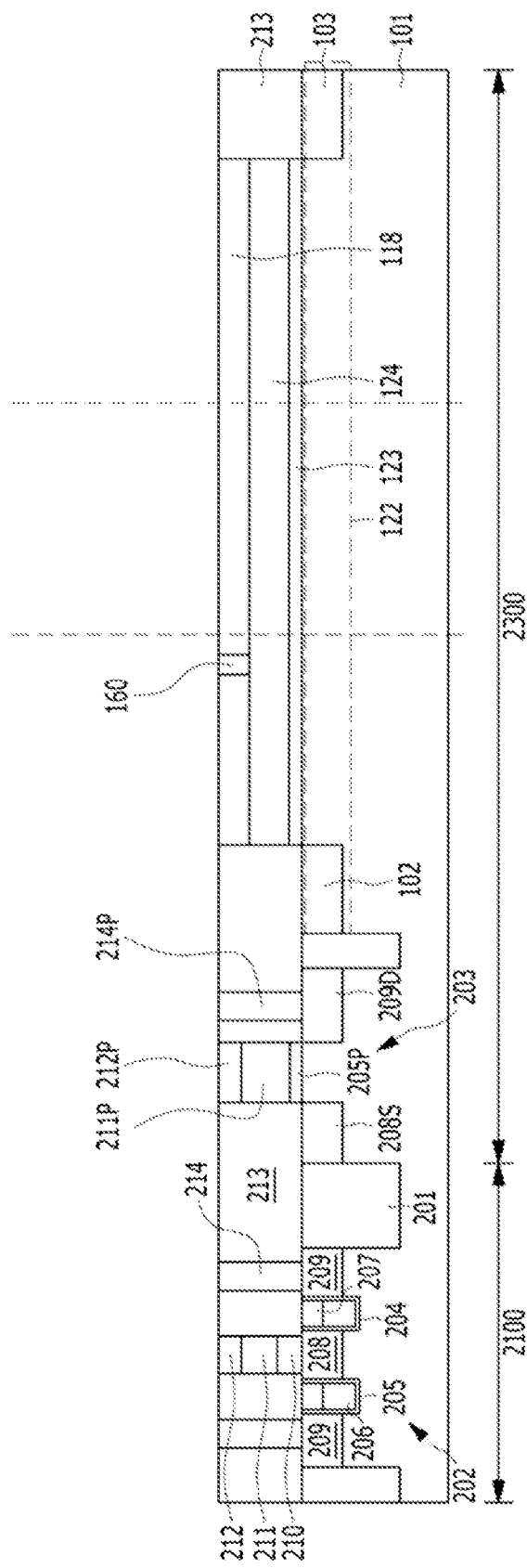

As shown in FIG. 7B, an interlayer dielectric layer 213 may be formed on the entire surface including the bit line structure and the first planar type capacitor.

Storage node contact plugs 214 are formed through the interlayer dielectric layer 213. The storage node contact plugs 214 may be formed in the cell region 2100. While forming the storage node contact plugs 214, a first metal contact plug 214P, which is electrically coupled to the drain region 209D of the peripheral transistor, may be formed.

A first internal plug 160 may be formed. The first internal plug 160 may be electrically coupled to the gate electrode 124. The storage node contact plugs 214, the first metal contact plug 214P and the first internal plug 160 may be formed simultaneously.

Figure 7C:
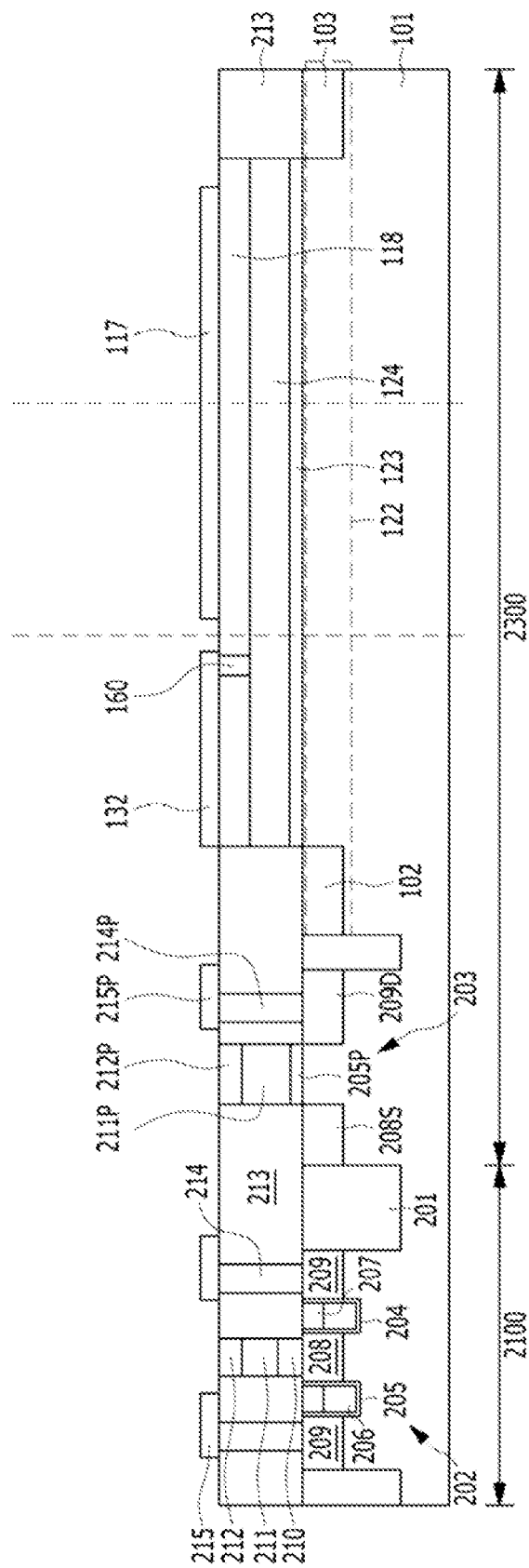

As shown in FIG. 7C, a metal layer may be formed on the interlayer dielectric layer 213. The storage node contact plugs 214, the first metal contact plug 214P, and the first internal plug 160 are formed in the interlayer dielectric layer 213. The metal layer may include tungsten or aluminum. By patterning the metal layer, storage node contact pads 215 are formed. While forming the storage node contact pads 215, a first planar type electrode 132 of a second planar type capacitor and a common node 117 may be formed simultaneously. The storage node contact pads 215, the first planar type electrode 132 of the second planar type capacitor and the common node 117 may be at the same level. The storage node contact pads 215, the first planar type electrode 132 of the second planar type capacitor and the common node 117 may be formed independently and separated from one another.

The first planar type electrode 132 of the second planar type capacitor and the common node 117 may overlap with the gate electrode 124. While forming the storage node contact pads 215, a first metal line 215P may be formed simultaneously. The first metal line 215P may be electrically coupled to the first metal contact plug 214P. The first planar type electrode 132 of the second planar type capacitor may be electrically coupled to the first internal plug 160.

Figure 7D:
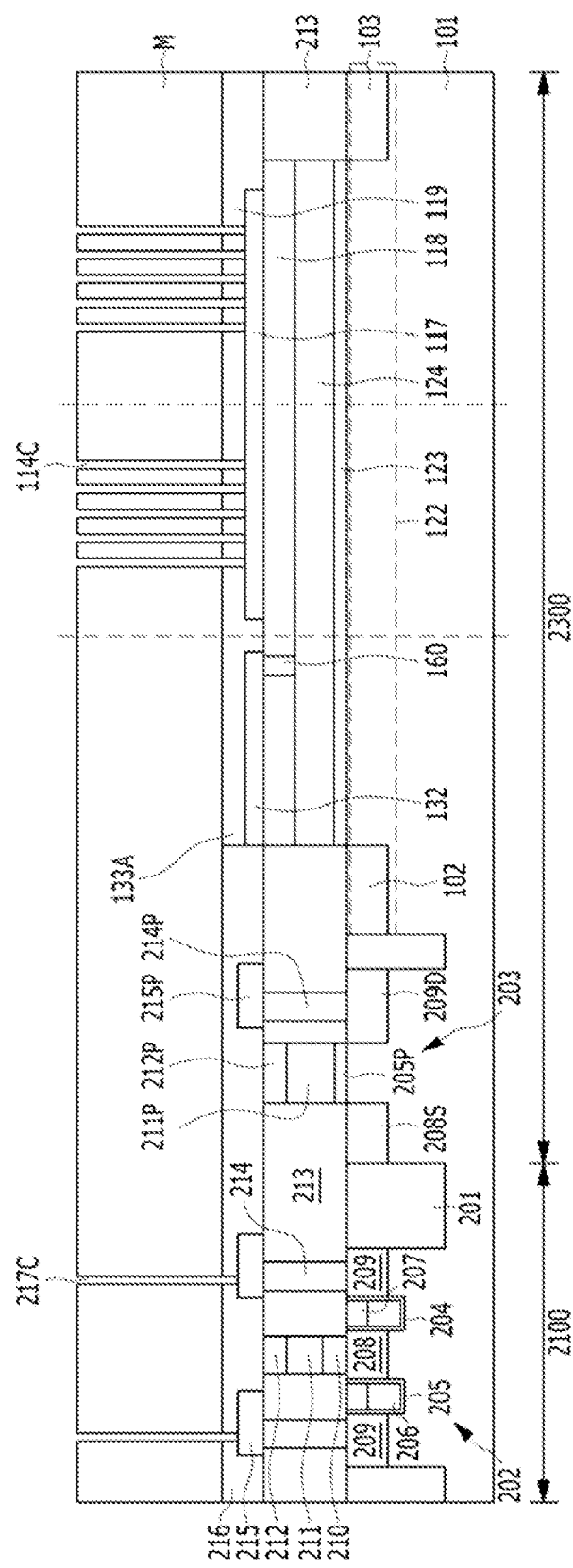

As shown in FIG. 7D, etch stop layers 216 and 133A may be formed on the entire surface including the storage node contact pads 215, first planar type electrode 132 of the second planar type capacitor and the common node 117. The etch stop layers 216 and 133A may be formed of silicon nitride.

A mold layer M is formed on the etch stop layers 216 and 133A. By etching the mold layer M and the etch stop layer 216, a plurality of cell capacitor open parts 217C are formed in the cell region 2100. While forming the cell capacitor open parts 217C, by etching the mold layer M and the etch stop layer 133A, a plurality of dummy cell capacitor open parts 114C may be formed in the peripheral circuit region 2300. The cell capacitor open parts 217C and the dummy cell capacitor open parts 114C may have the same shape. The cell capacitor open parts 217C and the dummy cell capacitor open parts 114C may form an array. The cell capacitor open parts 217C and the dummy cell capacitor open parts 114C may open the storage node contact pads 215 and the common node 117, respectively.

As shown in FIG. 7E, a plurality of cell storage nodes 217 are formed in the cell capacitor open parts 217C. A plurality of non-planar type storage nodes 114 are formed in the dummy cell capacitor open parts 114C. The cell storage nodes 217 and the non-planar type storage nodes 114 may be the same level. The cell storage nodes 217 may be electrically coupled to the storage node contact pads 215. The non-planar type storage nodes 114 may be electrically coupled to the common node 117. The cell storage nodes 217 and the non-planar type storage nodes 114 may have a pillar shape. In another embodiment, the cell storage nodes 217 and the non-planar type storage nodes 114 may have a cylindrical shape.

The mold layer M is selectively removed. While not shown, in order to prevent the cell storage nodes 217 and the non-planar type storage nodes 114 from leaning while removing the mold layer M, the mold layer M may have a structure which includes a support layer (not shown). The support layer may be formed of a material which has an etching selectivity with respect to the mold layer M. For example, the mold layer M may be formed of silicon oxide, and the support layer may include silicon nitride.

As the mold layer M is removed, sidewalls and top portions of the cell storage nodes 217 may be open. In the same manner as the cell storage nodes 217, sidewalls and top portions of the non-planar type storage nodes 114 may be open.

As shown in FIG. 7F, dielectric layers 218, 115 and 133B may be formed on the cell storage nodes 217 and the non-planar type storage nodes 114. The dielectric layers 218, 115 and 133B may be the same material.

Materials for forming top electrodes 219 may be formed on the dielectric layers 218, 115 and 133B. As the materials for forming the top electrodes 219, a first layer 219A, a second layer 219B and a third layer 219C may be sequentially stacked. Also, in the peripheral circuit region 2300, first layers 116A and 134A, second layers 116B and 134B and third layers 116C and 134C may be sequentially stacked. The first layers 219A, 116A and 134A, the second layers 219B, 116B and 134B and the third layers 219C, 116C and 134C may be formed simultaneously by using the same materials.

As shown in FIG. 7G, the top electrodes 219 are formed. The top electrodes 219 are formed in the cell region 2100, and non-planar type top electrodes 116 which cover the non-planar type storage nodes 114 may be formed in the peripheral circuit region 2300. The top electrodes 219 and the non-planar type top electrodes 116 may be at the same level. Moreover, the top electrodes 219 and the non-planar type top electrodes 116 may have stack structures which respectively include the first layers 219A and 116A, the second layers 219B and 116B and the third layers 219C and 116C.

While forming the top electrodes 219 and the non-planar type top electrodes 116, a second planar type electrode 134 of the second planar type capacitor may be formed simultaneously. The second non-planar type electrode 134 may have the first layer 134A, the second layer 134B and the third layer 134C which are sequentially stacked.

The dielectric layers 218, 115 and 133B may be etched so that the dielectric layer 218 in the cell region 2100 and the dielectric layers 115 and 133B in the peripheral circuit region 2300 are separated from each other. For example, the dielectric layers 218, 115 and 133B may respectively remain under the top electrodes 219, the non-planar type top electrodes 116 and the second planar type electrode 134 of the second planar type capacitor.

While etching is performed in the peripheral circuit region 2300 such that the dielectric layer 133A and the etch stop layer 119 are separated from each other. In another embodiment, it is to be noted that the dielectric layer 133A and the etch stop layer 119 may not be separated from each other. The dielectric layer 133A and the etch stop layer 119 are formed of the same material.

A second internal plug 161 which is electrically coupled to the second planar type electrode 134 of the second planar type capacitor 131 is formed. The second internal plug 161 may pass through the second planar type electrode 134. While not shown, subsequently, as shown in FIG. 4, contact plugs and plates may be formed.

As described above, the cell capacitor 220C and the non-planar type capacitor 113 of the high capacity capacitor 240 may have pillar-shaped structures and may be formed simultaneously through the same processes. Therefore, the top electrode 219 of the cell capacitor 220C and the second non-planar type electrode 116 of the non-planar type capacitor 113 may be formed simultaneously through the same processes. The second non-planar type electrode 116 of the non-planar type capacitor 113 may be formed by etching an extended portion of the top electrode 219, that is, a portion of the top electrode 219 which extends to the peripheral circuit region 2300. Further, the second planar type electrode 134 of the second planar type capacitor 131 may be formed by etching a portion of the top electrode 219.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a semiconductor substrate including a first region and a second region;
a first planar type capacitor including a gate electrode and positioned in the first region;
a non-planar type capacitor including a plurality of non-planar type electrodes and positioned in the second region;
a second planar type capacitor including a planar type electrode, positioned over the first planar type capacitor, and overlapping with the first planar type capacitor; and
a common node provided under the non-planar type capacitor,
wherein the second planar type capacitor comprises a first planar type electrode, a dielectric layer over the first planar type electrode, and a second planar type electrode over the dielectric layer,
wherein the first planar type electrode partially overlaps with the gate electrode, and
wherein the first planar type electrode of the second planar type capacitor and the gate electrode are electrically coupled with each other through a internal plug.

2. The semiconductor device according to claim 1, wherein the common node is electrically coupled to the plurality of non-planar type electrodes.

3. The semiconductor device according to claim 1, wherein the gate electrode of the first planar type capacitor has planar-shape extends under the non-planar type capacitor and under the second planar type capacitor.

4. The semiconductor device according to claim 1, wherein the first planar type electrode of the second planar type capacitor and the common node are positioned at the same level.

5. The semiconductor device according to claim 1,
wherein the plurality of non-planar type electrodes of the non-planar type capacitor comprise first non-planar type electrodes, a dielectric layer over the first non-planar type electrodes, and a second non-planar type electrode over the dielectric layer, and
wherein each of the first non-planar type electrodes has a pillar shape or a cylindrical shape.

6. The semiconductor device according to claim 1, wherein the first planar type capacitor comprises a metal-oxide-silicon (MOS) type capacitor, and
wherein the second planar type capacitor comprises a metal-insulator-metal (MIM) type capacitor.

7. The semiconductor device according to claim 1, wherein the first planar type capacitor and the second planar type capacitor are electrically coupled to each other in series.

8. The semiconductor device according to claim 1, further comprising:
a first plate electrically coupled between one end of the non-planar type capacitor and the first planar type capacitor,
a second plate electrically coupled between the other end of the non-planar type capacitor and the second planar type capacitor,
wherein the first planar type capacitor and the second planar type capacitor are coupled to each other in series between the first plate and the second plate,
wherein first and second voltages are applied to the first plate and the second plate, respectively.

* * * * *